United States Patent [19]

Villeneuve

[11] Patent Number: 4,993,308

[45] Date of Patent: Feb. 19, 1991

[54] DEVICE FOR BREATH CONTROL OF APPARATUS FOR SOUND OR VISUAL INFORMATION

[76] Inventor: Norman A. Villeneuve, Oasis Trailer Park, R.R. #4, North Bay, Ontario, Canada, P1B 8G5

[21] Appl. No.: 330,803

[22] Filed: Mar. 30, 1989

Related U.S. Application Data

[63] Continuation-in-part of Ser. No. 187,421, Apr. 28, 1988, abandoned.

[51] Int. Cl.$^5$ ...................... G01H 9/00; H03K 17/968

[52] U.S. Cl. ............................... 84/724; 84/DIG. 14; 200/DIG. 2; 200/DIG. 29; 340/825.19; 341/21

[58] Field of Search ......... 84/723, 724, 639, DIG. 14; 340/603, 608, 825.19; 341/21; 381/70; 200/DIG. 2, DIG. 29

[56] References Cited

U.S. PATENT DOCUMENTS

| | | | |
|---|---|---|---|
| 3,483,304 | 12/1969 | Jenny | 84/724 |
| 3,516,320 | 6/1970 | Hillairet et al. . | |
| 3,767,833 | 10/1973 | Noble et al. . | |
| 3,818,487 | 6/1974 | Brody et al. . | |
| 4,408,192 | 10/1983 | Ward et al. . | |
| 4,473,905 | 9/1984 | Katz et al. . | |
| 4,562,432 | 12/1985 | Sremac | 340/825.19 |
| 4,605,927 | 8/1986 | Katz et al. . | |
| 4,619,175 | 10/1986 | Matsuzaki | 84/DIG. 14 |

FOREIGN PATENT DOCUMENTS

| | | | |
|---|---|---|---|
| 3009864 | 9/1981 | Fed. Rep. of Germany | 84/723 |
| 236046 | 11/1985 | Japan | 340/603 |

*Primary Examiner*—Geoffrey S. Evans
*Attorney, Agent, or Firm*—Bacon & Thomas

[57] ABSTRACT

An air responsive control forms the basis for a mouth-blown device having a series of pipes in side-by-side relation into which the user blows or sucks. Signals are produced to operate apparatus such as a music synthesizer for a typewriter or computer. Each pipe has at least a section of light transmitting material. Inside that section, movable actuator such as a ball moves out of a light path between a light source and a photo-sensitive responder by sucking on or blowing by an operator. When the ball blocks the light path there is now signal to the operated apparatus but when it moves out of the light path there is a signal. Both the light source and the photo-sensitive responder are outside the pipe, thus ensuring that there is no contact with saliva of any directly connected electrical part.

7 Claims, 4 Drawing Sheets

DEVICE FOR BREATH CONTROL OF APPARATUS FOR SOUND OR VISUAL INFORMATION

This application is a continuation-in-part of application No. 187,421 which will be abandoned upon filing of this application.

BACKGROUND OF THE INVENTION

1. Field of the Invention

This invention relates to a breath controlled switching device, for operating a multiswitched system such as a music synthesizer or other instrument for generating visual or sound information in response to signals.

2. Background to the Invention

In the field of musical instrument simulation many efforts have been made to electronically simulate the playing of orthodox instruments, wherein the operation of various means have been used to control electronic switching by means of which tone generators or other forms of music synthesizer are energized.

For example, in U.S. Pat. No. 3,516,326 issued June 23, 1970 to Hilliaret et al, discloses a harmonica in which air flow variations are sensed by piston and cylinder arrangements and motion of this mechanical transponder is directly transformed into electronic signals. The transponder is within the environment within the pipe and is necessarily operating in wet conditions under the influence of the breath and saliva of the operator. It may be difficult or impossible to prevent the condensation of moisture from the breath and /or the accumulation of saliva within the pipes. Nobel et al, in U.S. Pat. No. 3,767,833, discloses a somewhat similar system to that of Hilliaret, but Noble's device has only one pipe, different notes being achievable by keying. It would be desirable to devise a system in which there is no direct electrical connection to the transponder.

It is an object of the invention to provide a breath controlled device for providing signals to a generator of visual or information or music synthesizer, e.g. a harmonica, which may include a simple, low cost arrangement utilizing components that are insensitive to environmental hazards, such as the presence of saliva, and which are robust and long lives.

It is an additional object of the invention to provide other instruments, such as suck/blow operated typewriters or computer keyboards which are especially useful for the disabled.

SUMMARY OF THE INVENTION

In one embodiment the present invention provides a computer controlled device for producing signals for the operation of apparatus for producing sound or visual information in response to said signals, the device comprising; a mouth piece having a plurality of air pipes adapted for the selective passage of sucked and blown air from an operator, at least a portion of each air pipe comprising a light transmitting wall adapted to allow transmission of light through the pipe; light responsive means located on one side of the pipe adapted to receive light from the other side of the pipe through the light transmitting wall; actuating means within each pipe movable under the action of air displacement within the pipe from a first position in which it blocks the transmission of light through the pipe into a second position in which it allows transmission of light through the light transmitting wall, the actuating means being biased, in use, into its first position; and photo-sensitive signal generating means for each actuating means located in a path of transmitted light.

Preferably, light emitting means such as LEDs are provided on a side of each pipe opposed from the light responsive means, the light emitting means being adapted to illuminate said light transmitting wall.

In a further embodiment one or more pipes is provided with lip actuated shift controls. Thus, for example, in the case of a musical instrument, these additional switching means may be used to switch pitch ranges, eg. octaves, while the air blown switching function can simultaneously be maintained unimpeded.

When the generator of sound or visual information is a typewriter keyboard or a computer keyboard, using, for example, a row of twelve pipes in side-by-side arranged relation, the provision, for instance, of a two position mouth shift control mode gives two different ranges for each blow controlled signal or each suck controlled signal thereby providing a 48-character capability.

Each pipe may be arranged to be directionally responsive to both exhalation and inhalation air flow, by the provision of additional actuating means in each pipe. A pipe especially designed for "soft" blow and/or suck may have means to concentrate or direct the air flow to minimize air flow requirements for moving the actuating means.

BRIEF DESCRIPTION OF THE DRAWINGS

An embodiment of the invention will now be described by way of example with reference to the drawings, in which.

DESCRIPTION OF PREFERRED EMBODIMENTS

Figure 1:
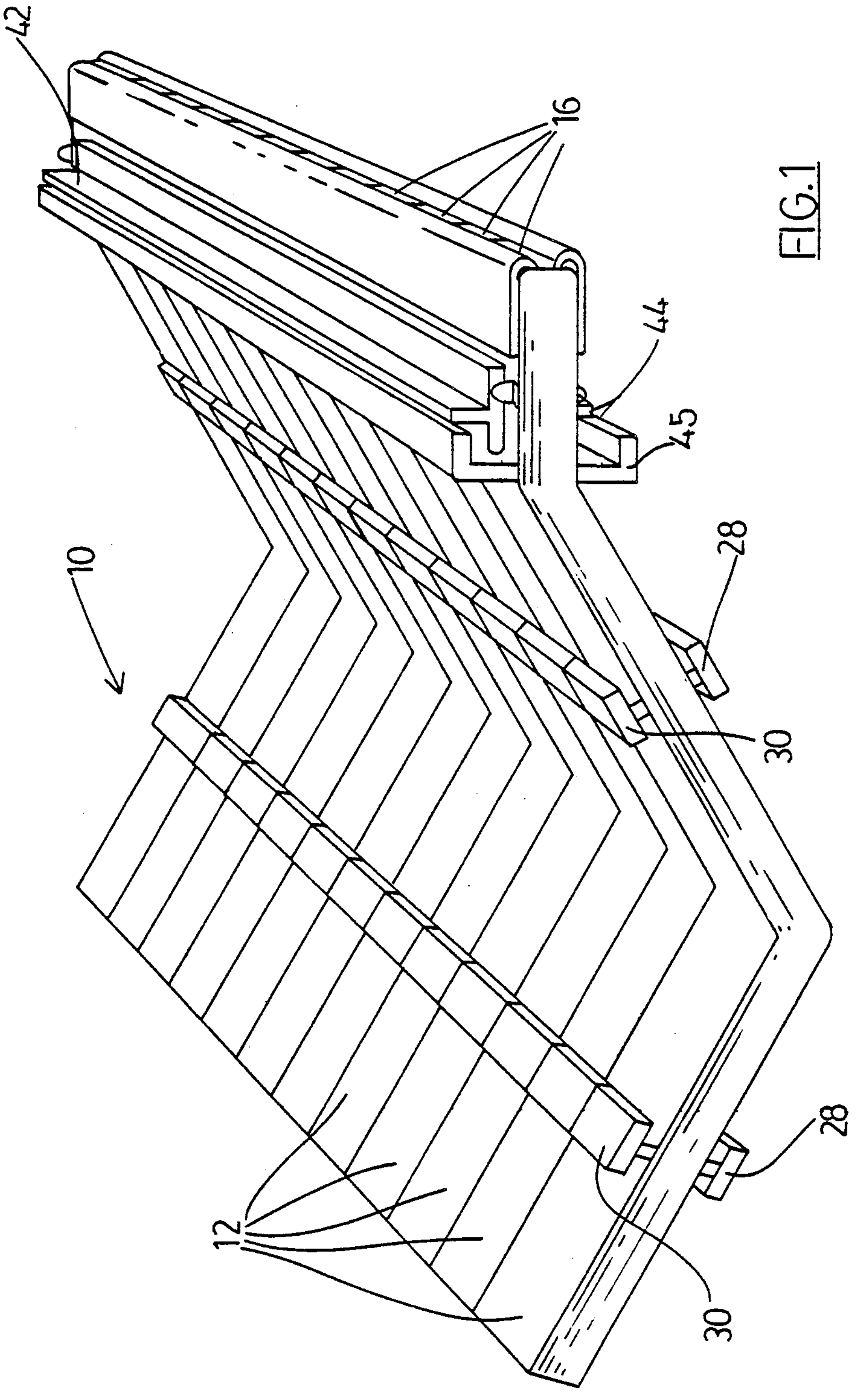
FIG. 1 is a view of one device according to the invention.
Figure 2:
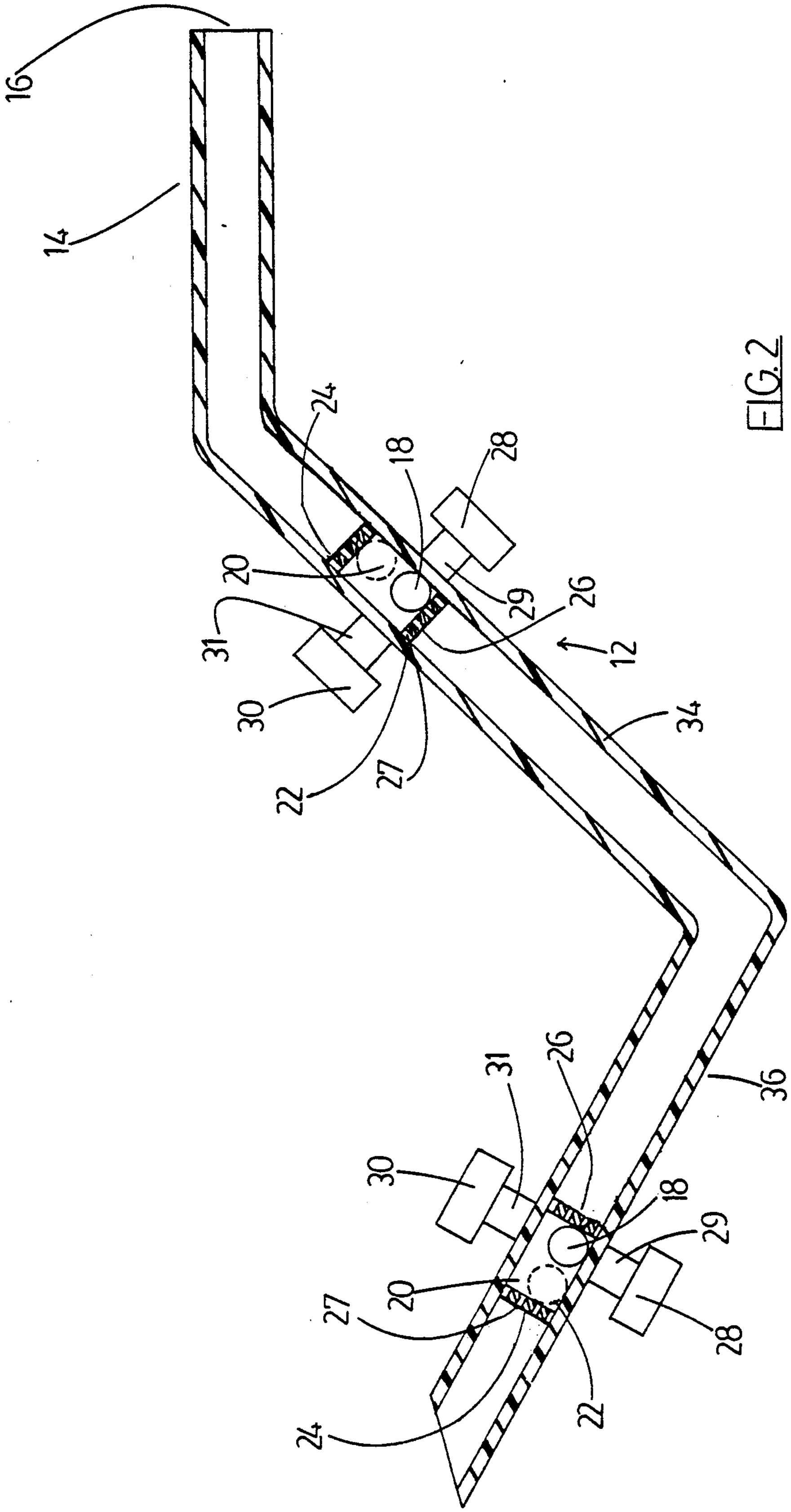
FIG. 2 is a section through a pipe of the device shown in FIG. 1.

The drawings show a breath controlled switching device 10 which is primarily intended for use in producing signals which apparatus may be used to operate a music synthesizer to function, for example as a harmonica. The device 10 is, however, suitable for producing signals to correspond with those of a typewriter or computer keyboard.

The device 10 comprises a plurality of pipes 12. Twelve pipes 12 are illustrated, but this number is not critical and is dependent on the number of different signals it is desired to send to the operated apparatus and on the number of shifts available different sets of operands of the operated apparatus.

Each pipe 12 as illustrated comprises a mouthpiece 14 allowing access of the breath of a user to an opening 16 of each pipe 12. The openings 16 may suitably be at the ends of pipes 12 as illustrated but other arrangements are possible.

Each pipe 12 contains at least one ball 18 which is movable in the pipe in response to the user blowing or sucking on the pipe. The object need not be ball 18 as illustrated, but may be any object which will move in the pipe in response to the users breath.

The or each ball 18 is contained in a chamber 20 of the pipe 12, the chamber 20 being formed by a portion 22 of the pipe wall which is able to transmit light therethrough and partition walls 24, 26 which allow the passage of gas current therethrough. For example, as illustrated the partition walls 24, 26 may have apertures 27 therethrough. Alternatively, partition walls 24, 26 may be mesh or other open structure.

The light transmitting wall portion 22 may suitably be clear plastics material and it is conventional that the whole pipe 12 be formed of this material for each of manufacture. However, for the purpose of emphasizing the presence of the light transmitting portion 22, the drawings indicate a change of material for the body of the pipe 12 and the light transmitting wall portion 22.

To one side of each pipe 12 adjacent a light transmitting wall portion 22 is a photo-sensitive switch 30, suitably photo transistor.

In use, the generally opaque ball 18 in chamber 20 occupies an at-rest position resting against partition 26. When there is air flow in the pipe 12 to displace ball 18 to the position shown in phantom light may pass through the transmitting wall portion 22 from one side of pipe 12 to the other. When this is so, photo-sensitive switch 30 will conduct and a signal will be produced. When ball 18 returns to its original position, light will be shut off and photo-sensitive switch 30 will not conduct and no signal will be present. While it is possible to use the device 10 so that the light transmitting portions 22 of pipes 12 opposed from the photo-sensitive switches 30 are illuminated by any convenient light source, it is convenient to provide a light source 28 for each pipe located opposed to photo-sensitive switch 30. Each light source 28 may be a light emitting diode LED.

Again for purposes of convenience, the photo-sensitive switch 30 and LED 28 need not abut light transmitting wall portion 22 but may be spaced therefrom by in line pipes 29, 31 which are also in line with the at-rest position of ball 18.

If ball 18 does not return to its at-rest position, photo-sensitive switch 30 will continue to conduct and the produced signal will be continuous. While this may be convenient for some purposes, it is generally not so and therefore means should be provided to return ball 18 to its at-rest position.

As illustrated, the return means are downwardly inclined portions 34 of the pipe 12 , and upwardly inclined portions 36 of the pipe 12. In portion 34, the at-rest position of ball 18 is resting on partition 26. When the user sucks on pipe 12, the ball will move upwardly to the position shown in phantom and the respective photo-sensitive switch 30 will conduct. When sucking stops, the ball falls back on partition 26, light is blocked from the photo-sensitive switch, and the switch does not conduct. During this operation any sucking action on the ball 18 in the upwardly inclined portion 36 rests on it respective partition 26 which prevents it from movement in the sucking direction.

When the user blows into pipe 12, the ball 18 in downwardly inclined portion 34 does not move due to it s respective partition 26 but ball in upwardly inclined portion 36 moves into the position shown in phantom and its respective photo-sensitive switch 30 conducts.

As shown, a forward portion of pipe 12 is shown as downwardly inclined and a rearward portion is shown as upwardly inclined. This juxtaposition may be reversed, or a straight pipe may be used to be fitted as desired by the user, or any other means of biasing the balls 18 or other movable object in the pipe may be used. Furthermore, it is not necessary to include actuating means movable by each of sucking and blowing in the same pipe. If desired, means actuating the photo-sensitive switch or blowing may be provided in one pipe and means actuating the photo-sensitive switch or blowing may be provided in another pipe. It may also be possible to provide two means in the same pipe 12 which actuate different photo-sensitive switches dependent on the strength of the blow.

When suck actuating means and blow actuating means are provided in the same pipe they may, if desired, be used to provide signals for the same operand, i.e. if the apparatus to be operated is a music synthesizer, suck and blow on the same pipe may each produce the same note. This is easily achieved by connecting the photo-sensitive switches 30 for both balls 18 of a pipe 12 in parallel. Resistors may be included in such circuit, for example, as heaters for the pipe and/or as ballasting resistors for the photo-transistors 30. However, it may be more usual for sucking and blowing to operate different functions of the operated apparatus. Thus, for twelve pipes, twenty-four alternative functions may be operated. For many purposes twenty-four operands are insufficient. A harmonica, for example, may use more than twenty-four notes and sharps and flats should be provided. For keyboard simulation, at least an upper and a lower case alphabet set, numbers and punctuation marks are required.

The number of signals which may be sent may be increased by increasing the number of pipes 12 in device 10. However, the device may become unweldy if the number of pipes is increased beyond a convenient maximum. Shift switches may be provided to shift the signals from the photo-sensitive switches to different ranges. These shift switches may be provided by any convenient means. For example, a manual switch may be provided a switching mechanisms associated with one or more pipes 12 may be utilized for the purpose.

Figure 3:
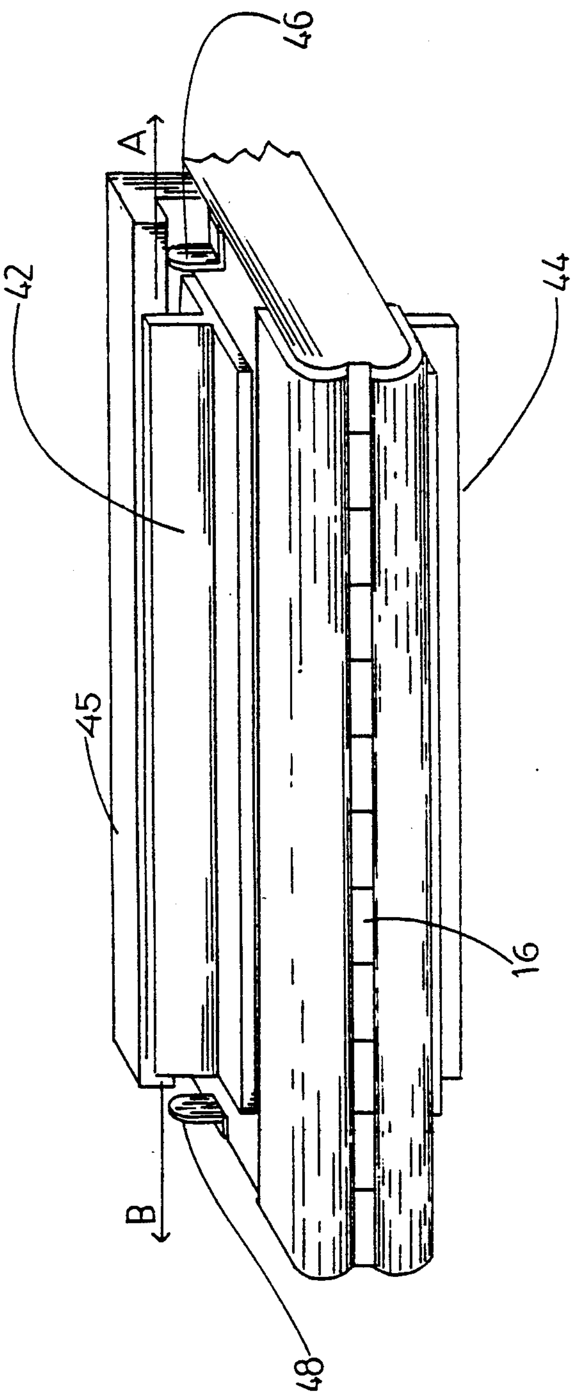
FIG. 3 is a front view of the device as shown in FIG. 1.
Figure 4:
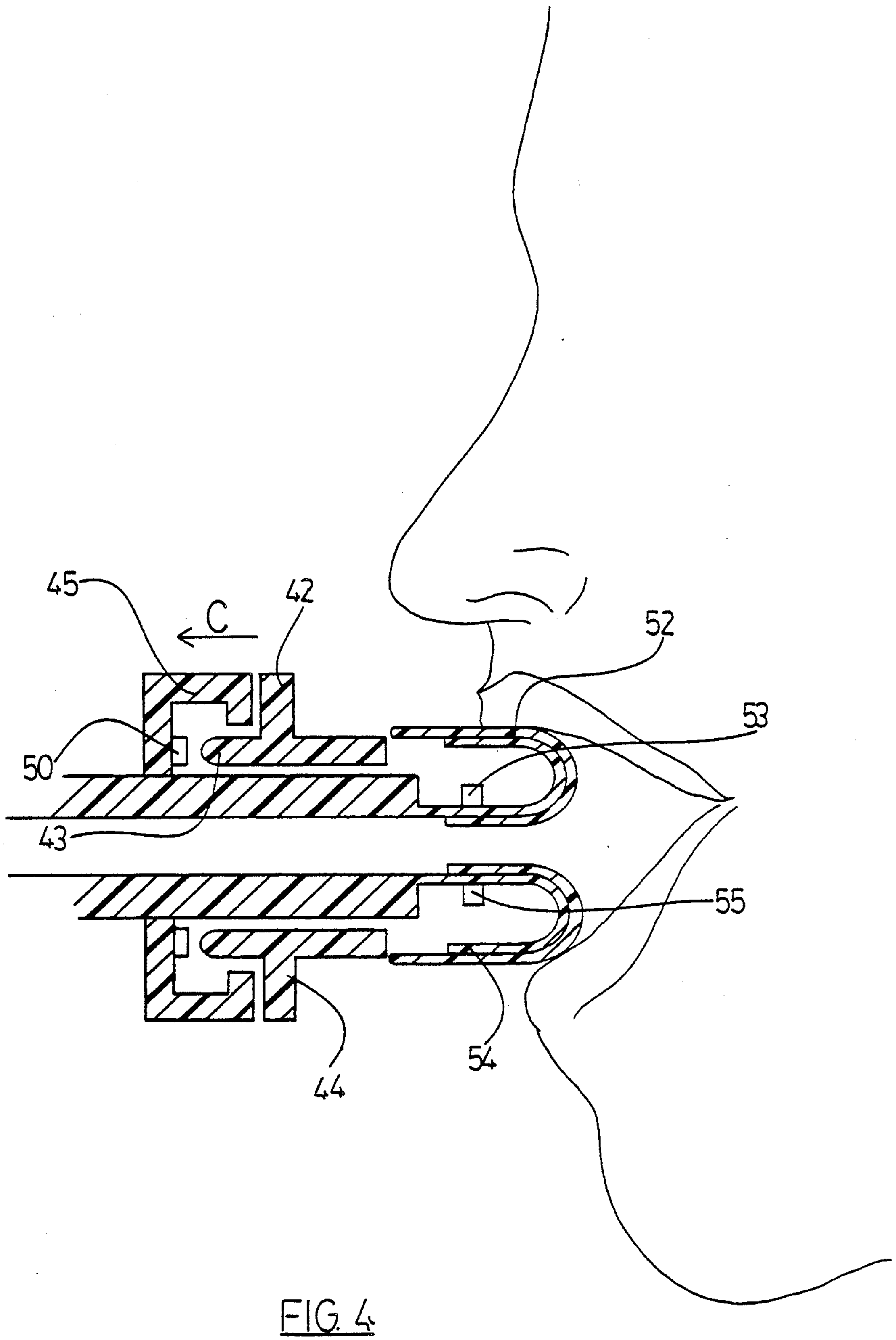
FIG. 4 is a section through the mouthpiece of the device of FIG. 1.

According to a feature of the invention, however, a shift switch or switches may be provided to be actuated by movement of upper lip bar 42 or lower lip bar 44. Each or both of these may be moved in three directions. Thus, upper lip bar 42 may be moved by the upper lip of the user in the direction of arrow A of FIG. 3 to operate shift switch 46, or it may be moved in the direction of arrow B of FIG. 3 to operate shift switch 48 or it may be moved in the direction of arrow C in FIG. 4 to operate shift switch 50. Similar operation of lower lip bar 44 is possible. Thus independent operation of lip bars 44 may provide at least as many as six shifts to different ranges of functions. However, if provision is made different shifts for combinations of positions of lip bars 42, 44, then the number of shifted ranges is greater than six.

Lip bars 42, 44 have a rear slide member 43 running in a slot in a housing 45. Each bar 42, 44 may be moved in the direction of arrows A or B with slide 43 moving longitudinally in the slot. Additionally, each bar 42, 44 may be pushed rearwardly in the direction of arrow C.

Additionally, further switches 53, 55 may be operated by depressing additional lip bars 52, 54. Lip bars 52, 54 do not operate in the same manner as lip bars 42, 44, but are each formed by a resiliently bent over portion of the mouthpiece. If the bars 52, 54 are to be used independently of each other, they are each conveniently used in conjunction with the other of the lip bars 44, 42. Thus upper lip bar 52 is conveniently used with lower lip bar 44, and lower lip bar 54 is conveniently used with upper lip bar 44. When neither of the lip bars 42, 42 is used with lip bars 52, 54 there may be a tendency to depress both of them together.

Because either of lip bars 52, 54 is easily operated in any of the positions of the lip bars 42, 44, these lip bars 52, 54 are, when the apparatus to be operated is a music synthesizer, conveniently used to produce sharps and flats of notes. Of course, any of switches 46, 48, 50 or the corresponding switches 53, 55 for lower lip bar 44 may be used for sharps or flats. However, since switches 46 and 48 can not be operated at the same time since different locations of lip bar 42 are required, it may be convenient to utilize one of switches 46 or 48 to produce sharps and the other to produce flats. The actual manner of producing the sharp and flat notes may be conventional. It is only important that the actuating means to charge the note by half a tone upwardly or downwardly be applicable to all the shifted ranges of notes.

I claim:

1. A device for producing signals for the operation of apparatus for producing sound or visual information in response to said signals, the device comprising:

a mouth piece having a plurality of air pipes adapted for the selective passage of sucked and blown air from an operator, at least a portion of each air pipe comprising a light transmitting wall adapted to allow transmission of light through the pipe;

light responsive means located on one side of the pipe adapted to receive light from the other side of the pipe through the light transmitting wall;

light emitting means on a side of each pipe opposed from the light responsive means, the light emitting means being adapted to illuminate said transmitting wall;

actuating means comprising a ball within each pipe movable under the action of air displacement within the pipe from a first position i which it blocks the transmission of light through the pipe into a second position in which it allows transmission of light through the light transmitting wall, the actuating means being biased, in use, into its first position wherein the ball is confined against movement other than between the first and second positions by partition through which air flows freely and located upstream and downstream off the ball in the pipe; and photosensitive signal generating means for each actuating means located in a path of transmitted light.

2. A device as claimed in claim 1, in which the ball is biased into its first position by the inclination of the pipe.

3. A device as claimed in claim 1, in which both a first ball movable into its second position under the influence of blown air within the pipe, and a second ball movable into its second position under the influence of sucked air, are provided in first and second light transmitting portions of the pipe.

4. A device as claimed in claim 1, in which at least one shift means is provided to shift signals from said photosensitive signal generating means to permit operation of first and second ranges of functions.

5. A device as claimed in claim 4, in which at least one lip bar is provided which is movable to operate at least one shift means.

6. A device as claimed in claim 5, in which upper and lower lip bars are provided 7. A device as claimed in claim 6, in which each lip bar is movable to operate each one of three shift means.

* * * * *